United States Patent
Actor et al.

(10) Patent No.: US 6,521,106 B1
(45) Date of Patent: Feb. 18, 2003

(54) COLLIMATED DEPOSITION APPARATUS

(75) Inventors: Geri M. Actor, Monte Sereno, CA (US); Ronald R. Cochran, Mountain View, CA (US); Vance E. Hoffman, Jr., Los Altos, CA (US)

(73) Assignee: Novellus Systems, Inc., San Jose, CA (US)

(*) Notice: Subject to any disclaimer, the term of this patent is extended or adjusted under 35 U.S.C. 154(b) by 0 days.

(21) Appl. No.: 08/665,639

(22) Filed: Jun. 18, 1996

Related U.S. Application Data

(63) Continuation of application No. 07/992,285, filed on Dec. 16, 1992, now abandoned, which is a continuation-in-part of application No. 07/780,882, filed on Oct. 23, 1991, now Pat. No. 5,330,628, which is a continuation of application No. 07/471,212, filed on Jan. 29, 1990, now abandoned.

(51) Int. Cl.[7] .......................... C23C 14/34; C23C 14/35
(52) U.S. Cl. ....................... 204/298.11; 204/298.06; 204/298.19; 204/298.2; 204/192.12
(58) Field of Search ................. 204/192.12, 298.06, 204/298.11, 298.19, 298.2

(56) References Cited

U.S. PATENT DOCUMENTS

| | | | | |
|---|---|---|---|---|
| 4,006,073 A | * | 2/1977 | Welch ............... | 204/298.06 X |
| 4,508,612 A | * | 4/1985 | Blackwell et al. ..... | 204/298.11 |
| 4,717,462 A | | 1/1988 | Homma et al. ............ | 204/298 |
| 4,724,060 A | * | 2/1988 | Sakata et al. ........... | 204/298.11 |
| 4,824,544 A | * | 4/1989 | Mikalesen et al. .. | 204/298.11 X |
| 4,988,424 A | * | 1/1991 | Woodward et al. . | 204/298.11 X |
| 5,171,412 A | * | 12/1992 | Talieh et al. ........ | 204/298.11 X |
| 5,223,108 A | | 6/1993 | Hurwitt ................ | 204/192.12 |
| 5,252,194 A | | 10/1993 | Demarary et al. ....... | 204/298.2 |

FOREIGN PATENT DOCUMENTS

| | | | | |
|---|---|---|---|---|
| EP | 0 313 750 | | 5/1989 | ........... C23C/14/35 |
| EP | 0 509 305 | | 10/1992 | ........... H01L/21/90 |
| EP | 0 512 296 | | 11/1992 | ........... H01L/21/90 |
| JP | 53-99082 | * | 8/1978 | ............ 204/298.11 |
| JP | 0017173 | * | 1/1987 | ............ 204/298.11 |
| JP | 63-83257 | * | 4/1988 | ............ 204/298.11 |
| JP | 0310965 | * | 12/1988 | ............ 204/298.11 |

OTHER PUBLICATIONS

Vossen et al., "Thin Film Processes", Academic Press, 1978, pp. 41–42.*

Lester et al., "Sputtering Cathode Glow Suppression Shields", IBM Tech. Dis. Bulletin, vol. 20, No. 3, 8/77, pp. 1177–1178.*

* cited by examiner

*Primary Examiner*—S. H. VerSteeg
(74) *Attorney, Agent, or Firm*—Roland Tso

(57) ABSTRACT

Sputtering apparatus using a collimating filter to limit the angles at which sputtered particles will reach the surface of the substrate or workpiece being processed is shown. The sputtering apparatus relies on a combination of a planar sputter source larger in size than the workpiece and having highly uniform emission characteristics across the much of its surface, including its center; a collimating filter; and low operating pressure to avoid scattering of sputtered atoms after they have passed through the collimation filter. In the preferred embodiment, the collimation filter is made from a material which has substantially the same thermal coefficient of expansion as the film which is deposited on the substrate. In one specific embodiment, a titanium collimation filter is used when the sputtering system is used to deposit films of titanium, titanium nitride or titanium/tungsten alloy.

15 Claims, 8 Drawing Sheets

COLLIMATED DEPOSITION APPARATUS

RELATED CASES

This application is a continuation of U.S. Ser. No. 07/992,285 filed Dec. 16, 1992, now abandoned, which is a continuation-in-part of U.S. Ser. No. 07/780,882 filed Oct. 23, 1991, now U.S. Pat. No. 5,330,628, which is a continuation of U.S. Ser. No. 07/471,212 filed Jan. 29, 1990, now abandoned

FIELD OF THE INVENTION

This invention pertains generally to sputter coating and, more particularly, to an apparatus and a method for depositing a thin film coating on a workpiece by collimated sputtering.

BACKGROUND OF THE INVENTION

Sputter coating is commonly employed in the formation of films on substrates in the manufacture of semiconductor devices. Planar magnetrons have long been used as sputtering devices to coat silicon wafers with various materials during the manufacture of integrated circuits. While aluminum has traditionally been the most common metallization material used in integrated circuits, other sputtered materials, such as titanium, titanium nitride, and titanium/tungsten alloy are now also commonly being used. Sputtering is also used during semiconductor manufacturing to deposit various non-metallic compounds either by direct sputtering or by reactive sputtering. Some of these non-metallic compounds, such as titanium nitride, are sufficiently conductive to be used in interconnect structures.

As integrated circuit densities have increased and device geometries have correspondingly shrunk, it has become more difficult to use sputter coating to form a uniform thin film, or step coating, which conforms to the shape of the surface of the workpiece or substrate where a step occurs, particularly at the upper or lower corner of an opening such as a hole or a via in the surface of the workpiece. It is also difficult to fill small openings (e.g., now commonly one micron, or less, in diameter or width) and to provide controlled film growth on the side and bottom walls of such openings. These difficulties arise because the sputtered atoms tend to leave the source in all directions, then collide with each other and scatter, arriving at the workpiece from a variety of angles. Particles (atoms) which arrive at angles much different than normal to the substrate surface tend to produce lateral growth on the surface. This lateral growth can result in overgrowth at the tops of the openings which can eventually close off via openings before they can be properly coated, resulting, for example, in an inadequate electrical connection between integrated circuit layers.

One approach to overcoming the foregoing problem is to use a collimation filter to limit the angles with which sputtered atoms strike the workpiece. The theory of collimation is that if, on average, the angles of incidence of sputtered particles are close to normal, then more of the atoms will penetrate to the bottoms of via holes, so that a conformal film will be formed in the via and there will be little or no overgrowth at the top of the via. The collimating filter typically comprises a plurality of cells in an array which is interposed between a sputter source and a workpiece. To reach the substrate, atoms emitted from the sputter source must pass through the cells without striking the cell walls, i.e., the cell walls intercept sputtered particles travelling at angles which are not close to being normal to the substrate. This causes a substantial amount of sputtered material to deposit on the filter itself.

However, there have been several problems associated with prior art sputtering systems employing collimation filters. First, unless the sputter source is very highly uniform, there will be an uneven film distribution on the surface of the wafer. Most sputter sources, particularly those which are used with the large semiconductor wafers common in the industry today (e.g., wafers having an eight-inch diameter), do not have a sufficiently uniform emission distribution to work with a collimation filter. These sputter sources rely on the scattering and angularity of sputtered particles to compensate for the fact that atoms are not emitted at a uniform rate from all points on the sputter target. For example, most prior art sputtering sources do not provide uniform erosion at the center of the target. However, a collimating filter negates the compensating effects of angularity and scattering. Thus, if a sputter source does not emit particles from its center, then an adequate layer of film will not be deposited at the center of the wafer.

Second, most sputter sources operate at pressures at which particle scattering is a significant effect over short distances. At the pressures commonly employed, the mean-free-path of sputtered atoms is relatively short. Accordingly, any directionality imparted to the particle flux by the collimation filter will be lost over a relatively short distance due to scattering. One attempted solution to this problem has been to place the collimation filter very close to the surface of the substrate to minimize scattering effects. However, this "solution" causes a shadowing effect such that the pattern of collimation filter cell walls is noticeably present on the surface of the wafer. Some prior art discloses means for moving either the filter or the wafer to avoid the shadowing effect. Movement of the wafer over a large area can also help overcome the aforementioned problem of non-uniformity. However, wafer movement is undesirable due to the added complexity it creates and the increased likelihood of contamination associated with moving parts within the sputter chamber.

Another problem with prior art sputtering sources using collimation to fill small diameter, high aspect ratio vias is that there has been no recognition of the need to optimize the aspect ratio of the collimation filter so that there is a desired balance between the deposition on the sidewall of the via and the bottom of the via. If the aspect ratio of the collimator cells is too high, there will be too little sidewall deposition. on the other hand, if the aspect ratio of the collimator cells is too low the sputtered atoms will behave much as if there is no filter with the same result, e.g., undesired film build-up and overhang at the corners of the via which blocks film from reaching the via bottom.

Yet another problem with prior art sputtering systems using collimation is that much of the sputtered material is deposited on the walls of the collimation filter rather than on the substrate. Not only does this reduce the deposition rate, thereby impairing wafer "through-put", but also has a tendency to increase the amount of particulate material in the sputter chamber. As a film of sputtered material is deposited on the cell walls the material tends to "flake" off. Some of the large particles thus formed end up on the surface of the wafer, where they can destroy the integrated circuit chips being fabricated. Semiconductor manufacturers go to great lengths to minimize the presence of extraneous particles in the wafer processing environment. It should also be noted that moving the wafers or collimation filter, as described above, can exacerbate the problem of extraneous particle creation.

The inventors of this invention have determined that the problem of extraneous particle creation is, in part, related to the mismatch in the thermal coefficients of expansion (TCE's) between the material used to construct the collimation filter and the material being sputtered. The filter, and the film deposited on it, go through substantial thermal cycling as the sputtering equipment is used. For example, a collimating filter may initially be at room temperature when the system is started, and then be heated to several hundred degrees centigrade as the system is operated.

The inventors have also recognized that the degree to which thermal mismatch causes problems is dependent on the properties of the material being deposited and the material used to construct the filter. The problem is particularly acute when depositing non-metallic materials which tend to have low ductility and are more prone to flaking. Most metallic films have sufficiently high ductility and adhesion so that they can tolerate appreciable mismatch in TCE between the film and the collimator. On the other hand, many non-metallic materials that are commonly deposited by sputtering, such as titanium nitride, are brittle and prone to flaking.

Most known prior art collimating filters have been constructed out of stainless steel. When sputtering aluminum, which has heretofore been the most common metallization layer used in semiconductor manufacture, extraneous particle creation has not been unacceptably poor. However, when sputtering films of newer materials, such as titanium, titanium nitride, or titanium/tungsten alloy, particle creation becomes unacceptable when using a collimation filter made of stainless steel. It is noted that these newer materials are finding increasing use as device geometries shrink and, hence, the need for the benefits of collimation increases.

OBJECTS AND SUMMARY OF THE INVENTION

It is in general an object of the present invention to provide a new and improved collimated sputtering apparatus for coating a workpiece such as a semiconductor wafer.

Another object of the invention is to provide apparatus of the above character which overcomes the limitations and disadvantages of sputtering systems heretofore provided.

Another object of the invention is to provide apparatus of the above character which is particularly suitable for use in thin films of sputtered titanium, titanium nitride and titanium/tungsten alloy.

It is yet another object of the present invention to overcome the problems which have, to date, been associated with the use of collimation filters in sputtering systems.

These and other objects are achieved in accordance with the invention by supporting a workpiece in a chamber, emitting particles from a sputter source substantially uniformly throughout an area of greater lateral extent than the workpiece, passing the particles through a particle collimating filter having a plurality of transmissive cells with an optimized length to diameter ratio positioned between the source and the workpiece to limit the angles at which the particles can impinge upon the workpiece, and maintaining the pressure within the chamber at a level which is sufficiently low to prevent substantial scattering of the atoms between the source and the workpiece. In the preferred embodiment of the present invention, the collimation filter is made of titanium or other material which is compatible with the material being deposited by sputtering.

DETAILED DESCRIPTION OF THE INVENTION

Figure 1:
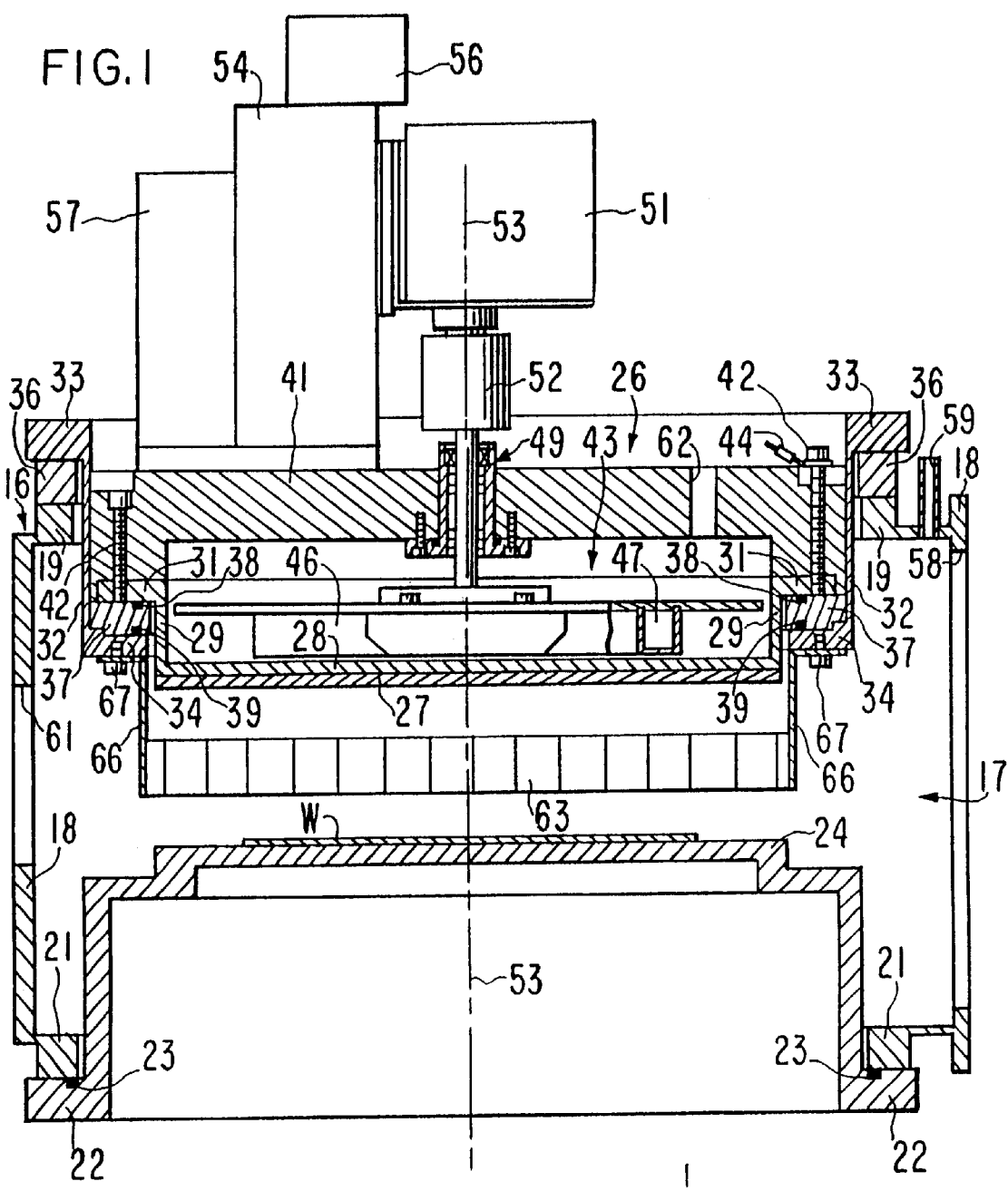
FIG. 1 is a diagrammatic cross-sectional view of one embodiment of sputtering apparatus incorporating the invention.
Figure 2:
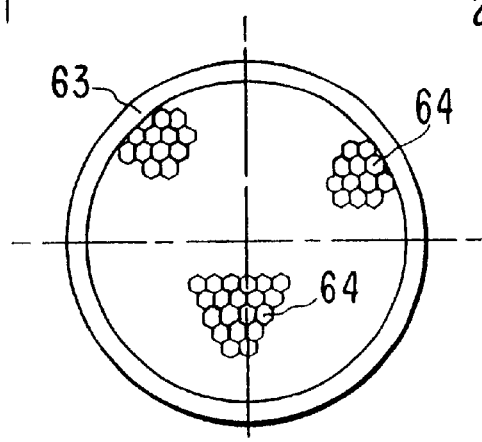
FIG. 2 is a top plan view, on a reduced scale, of a particle collimating filter for use in the embodiment of FIG. 1.

In the embodiment of FIG. 1, the sputtering apparatus has a housing 16 in which a sputtering chamber 17 is formed. The housing includes a cylindrical side wall 18 with annular flanges 19, 21 toward the upper and lower ends thereof, and a bottom wall 22 which mates with flange 21. An O-ring 23 provides a seal between the two walls.

The central portion of bottom wall 22 is raised to form a table 24 for supporting a wafer W or other workpiece to be coated. The workpiece may be secured to the table by suitable means such as a peripheral clamping ring (not shown) or other suitable means. Means of retaining a wafer in position are well known to those skilled in the art and need not be described in further detail. The table includes conventional heating and cooling means (not shown) for controlling the temperature of the workpiece.

The housing and support table are fabricated of an electrically conductive material such as stainless steel and are connected electrically to ground. In accordance with the present invention, if flaking of deposited film from any of these surfaces is a problem, they can, alternatively, be made of a material which is more compatible with the film being deposited. However, thus far the inventors have not found film flaking from these components to be a significant problem.

A source 26 of atoms for coating the workpiece is mounted in the upper portion of housing 16. In the embodiment illustrated, the source is a planar magnetron source using a closed-loop rotating magnet, of the type described in detail in Ser. No. 07/471,251, filed Jan. 26, 1990, and entitled "Rotating Sputtering Apparatus for Selected Erosion," the disclosure of which is hereby incorporated by reference. This application has now been abandoned in favor of continuation application Ser. No. 07/919,074. The source described in the application is commercially available from Varian Associates, Inc., (assignee of the present invention) of Palo Alto, Calif., under the trademark "Quantum". (It is noted that the source depicted in FIG. 1 may not exactly replicate the Quantum source which is more accurately portrayed in the aforementioned patent application Ser. No. 07/471,251; however, any differences are not deemed pertinent to the present invention.) An important feature of this source is that it provides a substantially uniform emission of particles over an extended target area which is larger than the workpiece. This ensures that a uniform distribution of particles reaches the entire surface of the workpiece, including the peripheral areas. While this particular source is presently preferred, any other source which provides a similarly uniform particle distribution can be employed. A particularly important feature of the source of the present invention is that it the extended area of uniform erosion includes the center of the sputter target.

Source 26 includes a planar, circular target 27 of a material to be deposited. The collimation filter of the present invention works particularly well with targets made of titanium and titanium tungsten alloy. In addition, it is particularly useful in connection with the reactive sputtering of films of titanium nitride, which is performed by sputtering from a titanium target in the presence of a partial pressure of nitrogen. Methods of reactive sputtering of titanium nitride are known to those skilled in the art and need not be described in further detail.

Sputter target 27 is disposed in parallel facing relationship to the workpiece and is of greater lateral extent than the workpiece. In one embodiment for use with wafers having a diameter of 8 inches, sputter target 27 has a diameter of 11.25 inches.

The target is mounted on the under side of an electrically conductive cathode plate 28 which has a cylindrical side wall 29 with an annular flange 31 at the upper end thereof. The cathode plate is supported by a cylindrical mounting bracket 32 with annular flanges 33, 34 at the upper and lower ends thereof. Flange 33 projects outwardly from side wall 29 and is positioned above the inwardly projecting housing flange 19. A spacer ring 36 is positioned between these flanges to permit adjustment of the spacing between the target and the workpiece, which is typically on the order of 1–3 inches.

Flange 31 on the cathode plate projects outwardly from side wall 29 and is positioned above the inwardly projecting flange 34 at the lower end of mounting bracket 32. A ring 37 of electrically insulative material is positioned between the flanges to insulate the cathode from the housing, and O-rings 38, 39 provide seals between the flanges and the insulator.

A cover 41 fabricated of an insulative material, such as fiberglass, is positioned within mounting bracket 32 and secured to flange 31 of the cathode plate by screws 42 to form a chamber 43 for the rotating magnet assembly of the magnetron. An electrical lead 44 is connected to one of the mounting screws 42 and to a suitable source (not shown) for applying a high negative potential to the cathode.

The magnet assembly includes a housing 46 in which a closed-loop array of magnets 47 is mounted. The structure of these magnets and the manner in which they provide substantially uniform erosion over substantially the entire area of the target are disclosed in detail in the aforementioned U.S. patent application Ser. No. 07/471,251.

Magnet housing 46 is mounted on a shaft 48 which passes through a seal assembly 49 in cover 41 and is connected to a motor 51 by a coupling 52 for rotation about an axis 53. Motor 51 is mounted on a slider assembly 54 which is driven by a linear motor 56 for movement along axis 53, and the slider assembly is mounted on a bracket 57 affixed to housing 16. The slider assembly permits the spacing between the magnet array and the target to be adjusted to control the magnetic field beneath the target. As discussed more fully in the aforementioned U.S. patent application Ser. No. 07/471,251, with an 11.25 inch target, the rotating magnet array provides substantially uniform erosion throughout a circular region having a diameter of approximately 10 inches centered about the axis of rotation, which is sufficient for coating an 8 inch wafer.

Housing 16 includes a port 58 to which a vacuum pump (not shown) is connected for evacuating chamber 17, and a gas inlet 59 through which an inert gas such as Argon is introduced to support the magnetron discharge. As discussed more fully hereinafter, the pressure within chamber 17 is maintained at a pressure which is sufficiently low to prevent the sputtered atoms from colliding with each other and scattering after they have passed through the collimation filter. It is contemplated that the present invention will be used with pressures on the order of 0.1–1.5 milliTorr; however, it has been determined that many of the advantages of the invention can be obtained using higher pressures.

Housing 16 also includes a port 61 through which wafers or other workpieces are transported into and out of chamber 17. This port is provided with a suitable closure such as a gate valve (not shown).

A port 62 is provided in cover 41 for introducing a coolant such as water into chamber 43 to cool the target and the magnet assembly.

A particle collimating filter 63 is positioned between the target and the workpiece to limit the angles at which the atoms from the source can arrive at the surface of the workpiece. This filter, together with the extended source and the absence of scattering, is important in preventing lateral film growth and in forming a step coating with controlled growth on the bottom and side walls of an opening such as a hole or via.

The collimating filter has a plurality of cells 64 with apertures through which the particles pass in line-of-sight fashion. The cells are aligned with their axes parallel to axis 53 and perpendicular to the surfaces of target 27 and workpiece W. Each cell has an acceptance angle $\Theta_{ACC}$ which is defined as $$\Theta_{ACC} = \arctan(d/l),$$

where d is the diameter of the aperture and l is the length of the aperture, or the height of the cell. The acceptance angle is thus the maximum angle from the perpendicular (i.e., normal to the substrate) at which particles can pass through the filter in a straight path without striking the wall of a cell. The aspect ratio of the cells, i.e., the ratio of the cell height to the diameter, is referred to as the aspect ratio of the filter.

In the embodiment illustrated, the cells and their apertures are hexagonal in cross-section. This shape is preferred to a circular shape or a square shape because of the unusable areas between the walls of adjacent circular cells and the substantial difference in the distances between the opposing sides and the opposing corners of square cells. In this disclosure, the diameter utilized in defining the acceptance angle and the aspect ratio of the hexagonal cells is the mean diameter of the cells, although either the flat-to-flat diameter or the apex-to-apex diameter could be utilized for this purpose, if desired.

In the embodiment of FIG. 1, collimating filter 63 is positioned approximately midway between the target and the workpiece and is attached to mounting bracket 32 by brackets 66 and screws 67. In other embodiments, collimating filter 63 may be placed relatively closer to the wafer to minimize scattering effects, so long as it is not placed so close as to cause shadowing as described above. Depending on the application, collimator 63 may be placed in the range of 0.5" to 2.0" from the wafer and between 1" to 5" from the sputter target.

According to the present invention, collimating filter 63 has an aspect ratio in the range of 0.5:1 to 4:1, preferably between 1:1 to 3:1, with a mean cell diameter on the order of ⅜–⅝ inch for an 11.25 inch target and 8 inch wafer separated by a distance on the order of 1–6 inches.

Figure 5A:
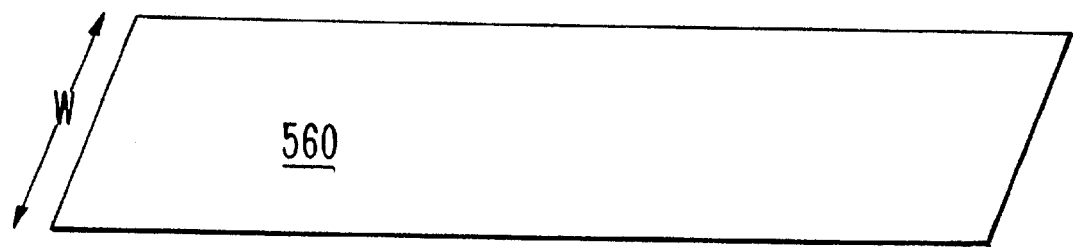
FIGS. 5a–5c are isometric views of a portion of a collimation filter of the present invention at various stages of construction.
Figure 5B:
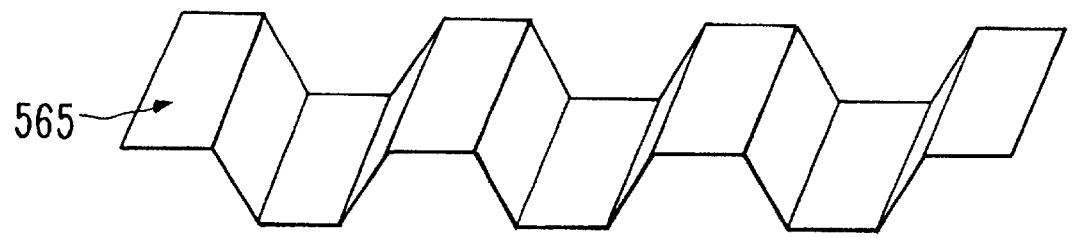
Figure 5B:
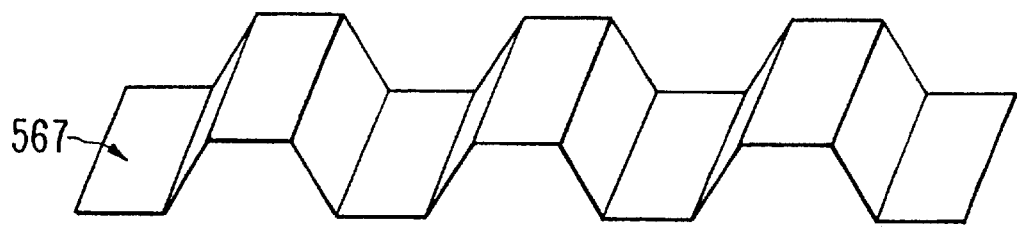
Figure 5C:
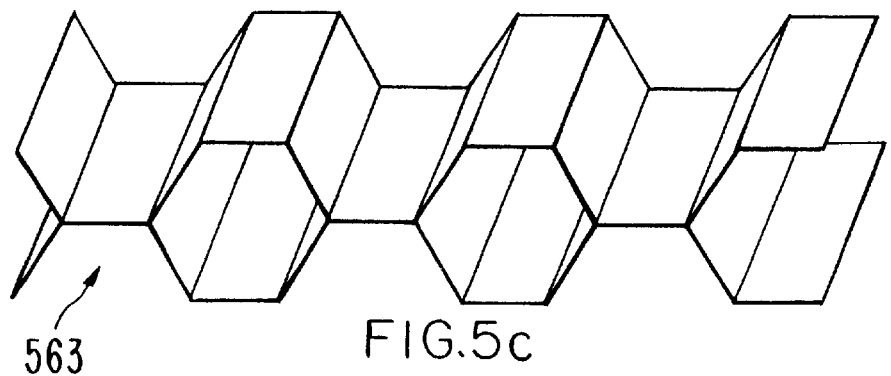

When sputtering titanium, either non-reactively to produce a titanium film or reactively to produce a titanium nitride film, or when sputtering a titanium/tungsten alloy non-reactively to form a titanium/tungsten film, collimating filter 63 is, according to the present invention, constructed of titanium. Such a collimating filter may be fabricated starting with ribbons or elongate sheets of titanium having the desired width "W" (equal to the desired cell length). An example of a piece of titanium ribbon 560 is shown in FIG. 5a. The titanium ribbon used in connection with the present invention may have a thickness of approximately 15 mils. After being cut to length, ribbons 560 are then stamped into corrugated pieces having half hexagons with alternating orientations. Two such pieces, 565 and 567, are shown in FIG. 5b. The stamped ribbons are then successively joined by spot welding to form rows of cells having the desired hexagonal cross-sectional shape. FIG. 5c shows two such ribbons that have been joined together to form a portion of a collimating filter 563.

Figure 3A:
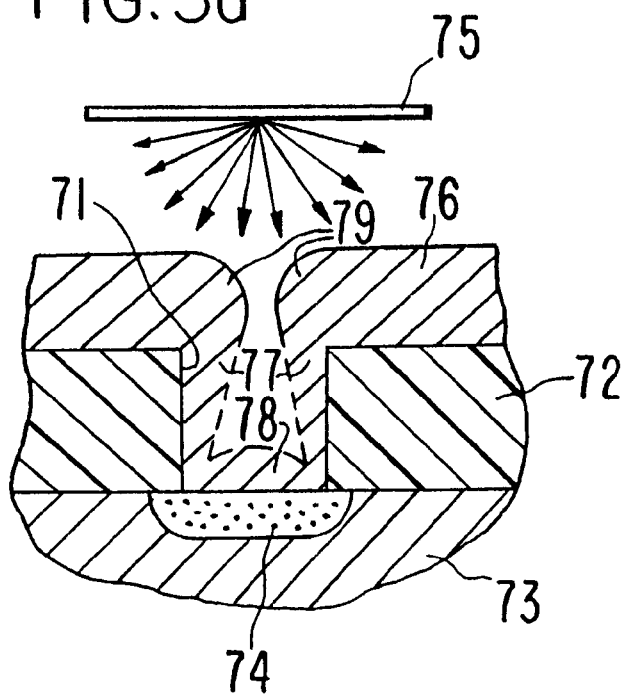
FIGS. 3a–3b are fragmentary cross-sectional views illustrating some of the problems encountered in the formation of a step coating with conventional sputtering techniques.

FIG. 3a illustrates some of the problems encountered in forming a step coating by sputtering prior to the invention. In this example, a hole 71 having a diameter of one micron is formed in a one micron layer 72 of dielectric material on a silicon substrate 73. Hole 71, therefore, has an aspect ratio of 1:1. A metallized contact is to be formed over a doped region 74 in the substrate at the bottom of the hole. The metallization material is sputtered from a target 75 above the wafer. It is assumed that each point on the target uniformly emits particles with a cosine distribution, and after collision and scattering, the particles arrive at the target at angles (Θ) ranging from 0 to 90 degrees to the normal. However, as described above, known prior art sputtering sources do not provide the assumed level of uniformity.

In this example, particles arriving at angles greater than 45 degrees cannot impinge upon the bottom wall of the hole. When such particles impinge on the upper surface of layer 72 they tend to promote lateral growth on the surface of the wafer. As a result, a relatively thick film 76 is built up on the surface of the wafer, with relatively thin, nonuniform coatings 77, 78 on the side and bottom walls of the hole. In addition, the lateral growth of the surface film produces an overgrowth 79 at the top of the hole, which eventually can close off the hole completely and prevent particles from entering it. When closed off in this manner, the coating on the side walls and the bottom wall is subject to voiding, as illustrated by broken lines in the drawing, and there will be areas where no coating is formed. Thus, good electrical contact to region 74 will not be made.

Figure 3B:
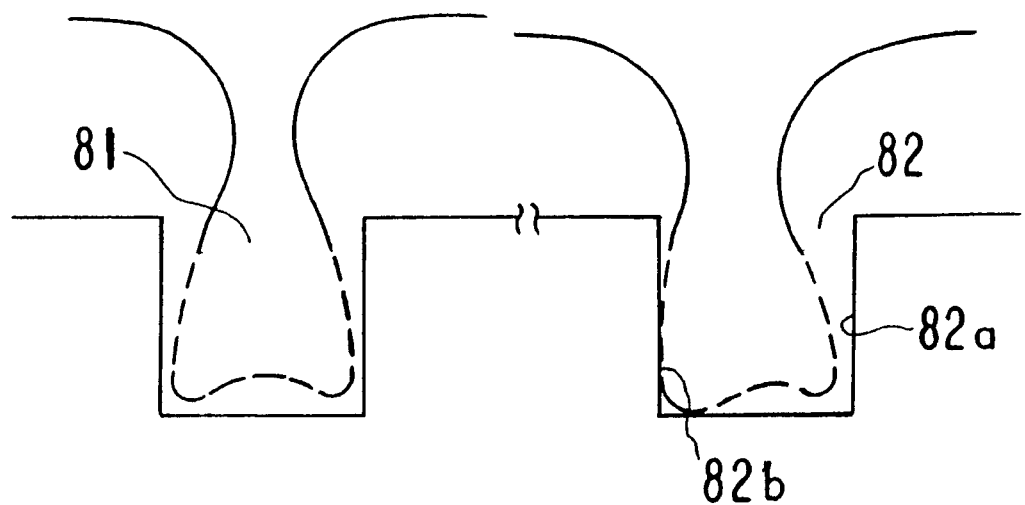

FIG. 3b illustrates a problem of asymmetrical coating which can occur in openings near the edge of a wafer with conventional sputtering techniques utilizing an 11.25 inch planar source, a surface deposition rate of 1 micron per minute, a target-to-wafer spacing of 7 cm, a sputtering pressure on the order of 3–7 milliTorr, and a wafer table temperature of 250° C. In this figure, two holes 81, 82 are shown. Hole 81 is near the center of the wafer, and hole 82 is near the edge. Near the center of the wafer, the particle distribution is relatively uniform, and a relatively symmetrical coating is formed in hole 81. Toward the edge of the wafer, however, the distribution of particles is not as uniform, and the inwardly facing side wall 82a of hole 82 receives more particles than the outwardly facing wall 82b. This results in an asymmetrical coating of the side walls as well as the bottom wall.

According to the present invention, with the collimation filter, the extended source, proper selection of pressure, and proper selection of the aspect ratio of the filter, it is possible to form good step coatings in which the growth of film on the side and bottom walls of an opening is controlled.

FIGS. 4a–4d illustrate the effect of pressure on the angular distribution of sputtered particles arriving at the surface of a workpiece without a collimation filter and for three filters of different aspect ratios. In the figures, the angle of arrival (Θ), relative to the perpendicular, is plotted along the x-axis and the number of particles arriving at the surface is plotted along the y-axis. The data for these figures was obtained by computer simulation assuming uniform erosion from an 11-inch planar source, with a 150 mm substrate and a 9 cm source-to-substrate spacing in the Argon sputtering of aluminum. (The validity of the data obtained by computer simulation has since been confirmed in actual experiments.) The particle count is arbitrary and was selected to be large enough to give meaningful distribution data. The same overall particle count was used in each of the simulations so that the relative reduction in particles reaching the substrate in successive figures reflects the higher percentage of material that is intercepted by the filter and, thus, not deposited.

Figure 4A:
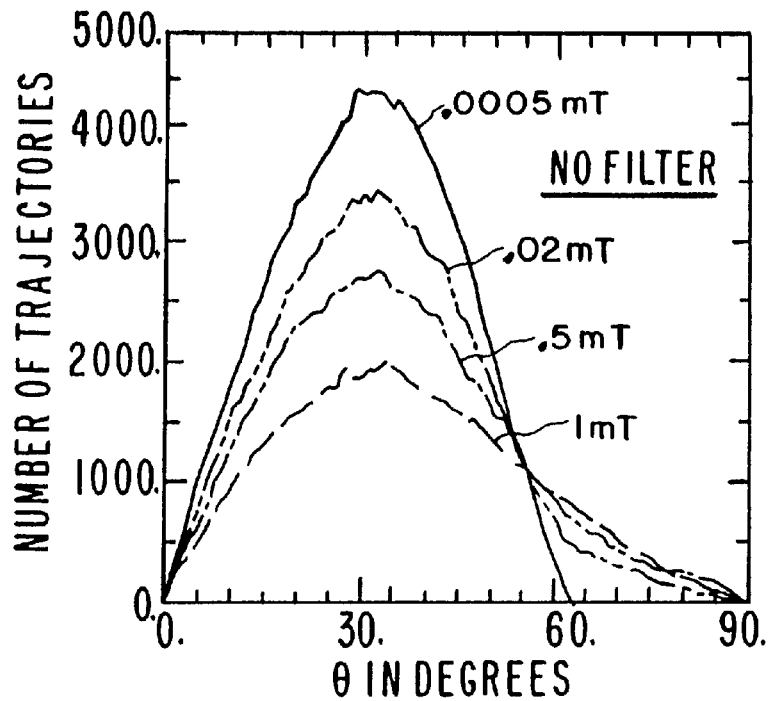
FIGS. 4a–4d are graphical representations showing the relationship between pressure and the angular distribution of particles arriving at the surface of a workpiece with collimating filters of different aspect ratios.
Figure 4B:
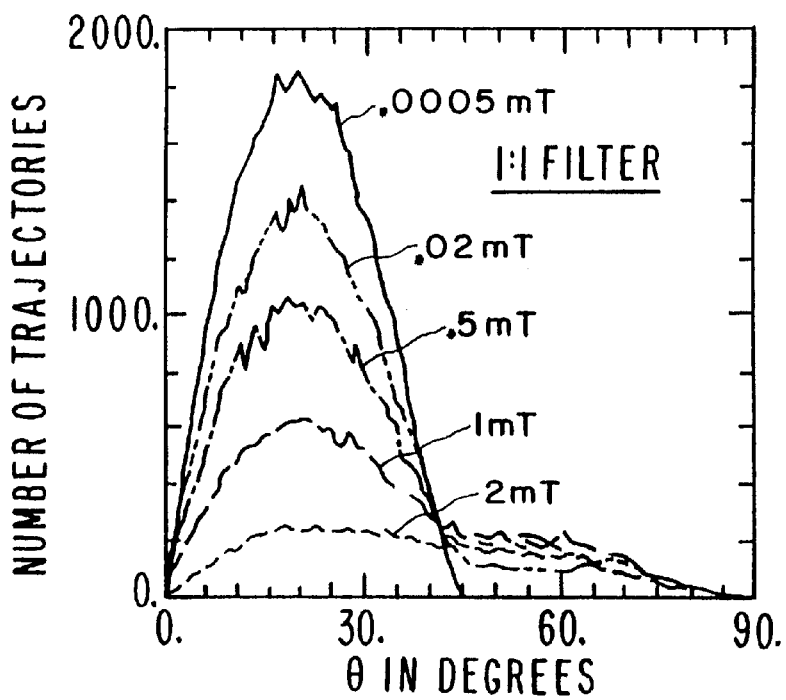
Figure 4C:
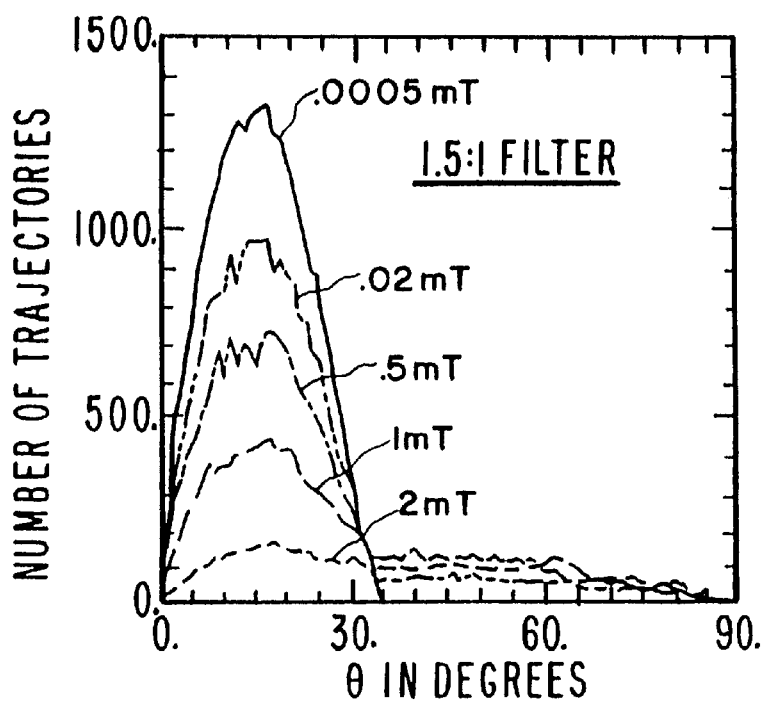
Figure 4D:
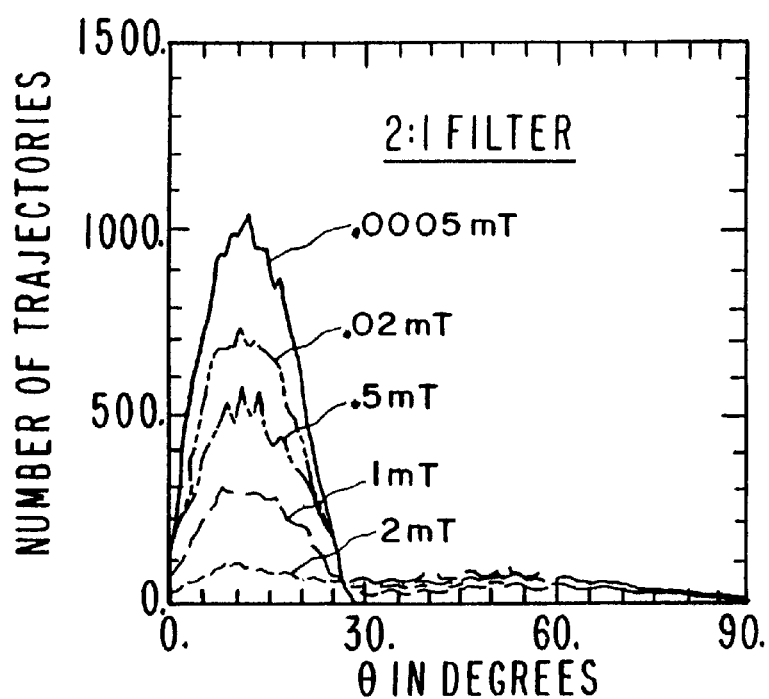

In each of FIGS. 4a–4d, curves representing the distributions for operating pressures of 0.0005 milliTorr, 0.02 milliTorr, 0.5 milliTorr and 1 milliTorr are shown, and in FIGS. 4b–4d a curve for a pressure of 2 milliTorr is also shown.

FIG. 4a shows the distribution with no filter, and FIGS. 4b–4d show the distributions with filters having aspect ratios of 1:1, 1.5:1 and 2:1, respectively.

Without the filter, the distribution is fairly symmetrical at the lower pressures for angles up to about 60 degrees. At the higher pressures, the distribution is less symmetrical, and greater relative numbers of the particles arrive at angles greater than 60 degrees.

With each of the filters, the distribution is fairly symmetrical at the lower pressures up to the acceptance angle of the filter. At the higher pressures, the distribution is less symmetrical, and greater relative numbers of the particles arrive at angles greater than the acceptance angle. The increase in the number of particles outside the acceptance angle at the higher pressures is due to scattering of the particles at the higher pressures after they transit the collimation filter. These curves illustrate the importance of lower pressures to avoid scattering so that as many atoms as possible reach the wafer surface at angles less than or equal to the acceptance angle of the collimation filter.

Figure 6A:
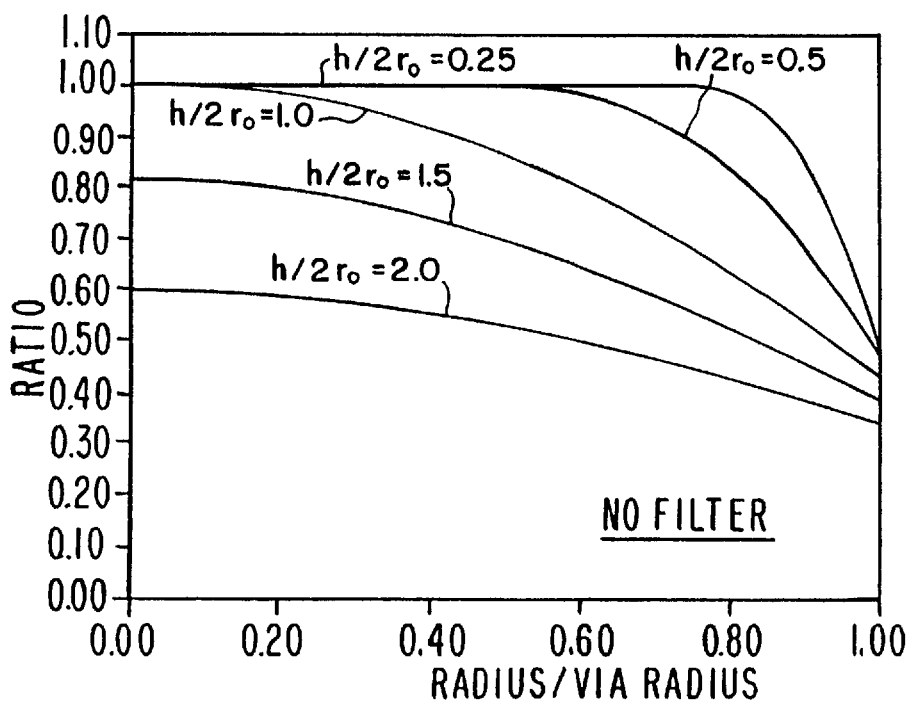
FIGS. 6a–6d are graphical representations showing the relationship between bottom wall deposition rate and aspect ratios of holes or vias and collimating filters.
Figure 6B:
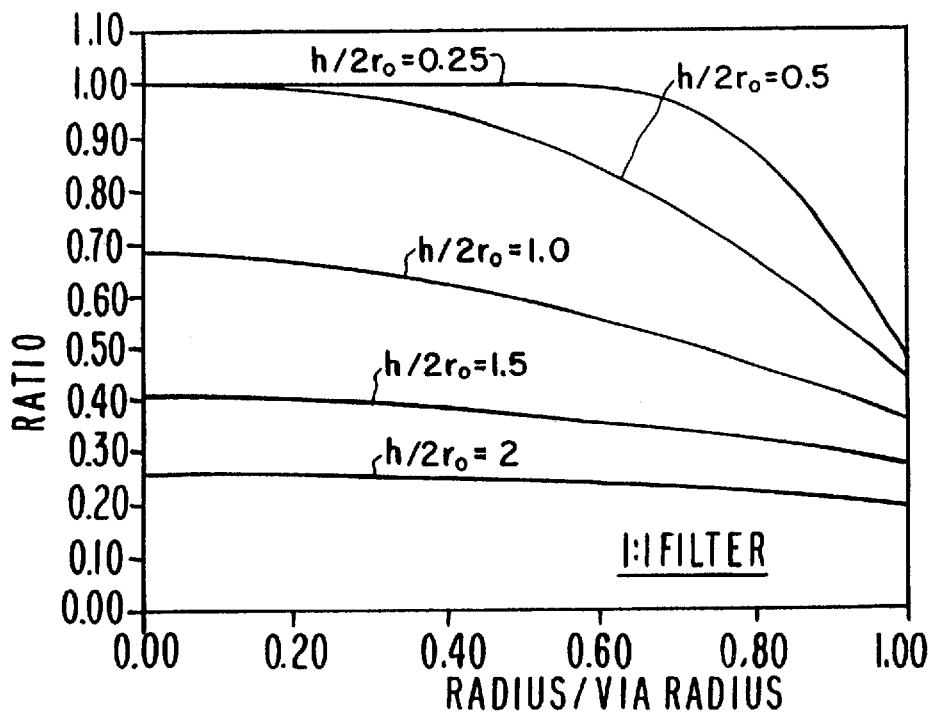
Figure 6C:
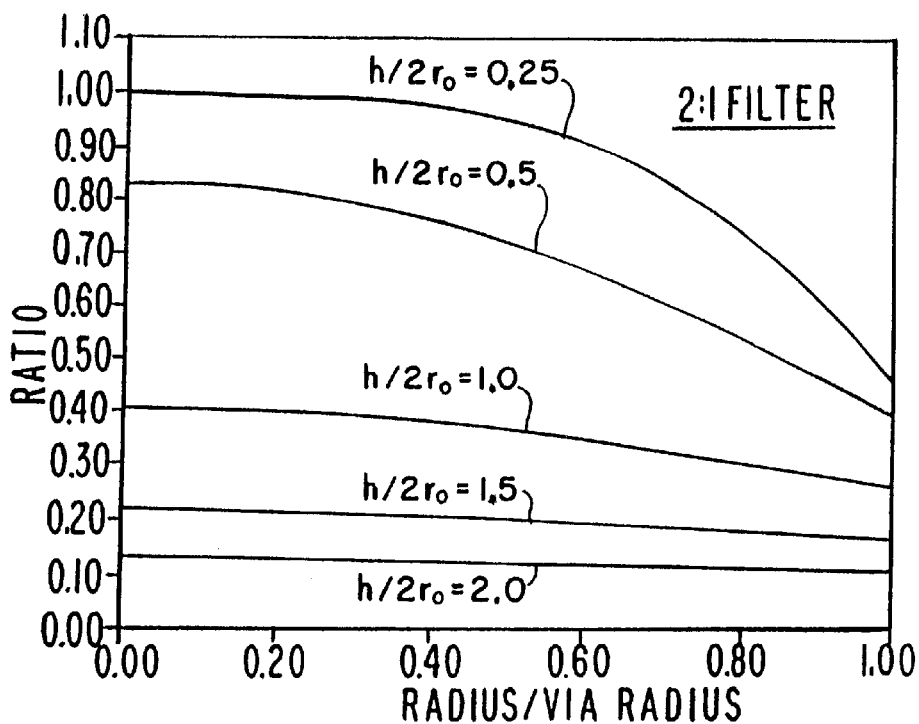
Figure 6D:
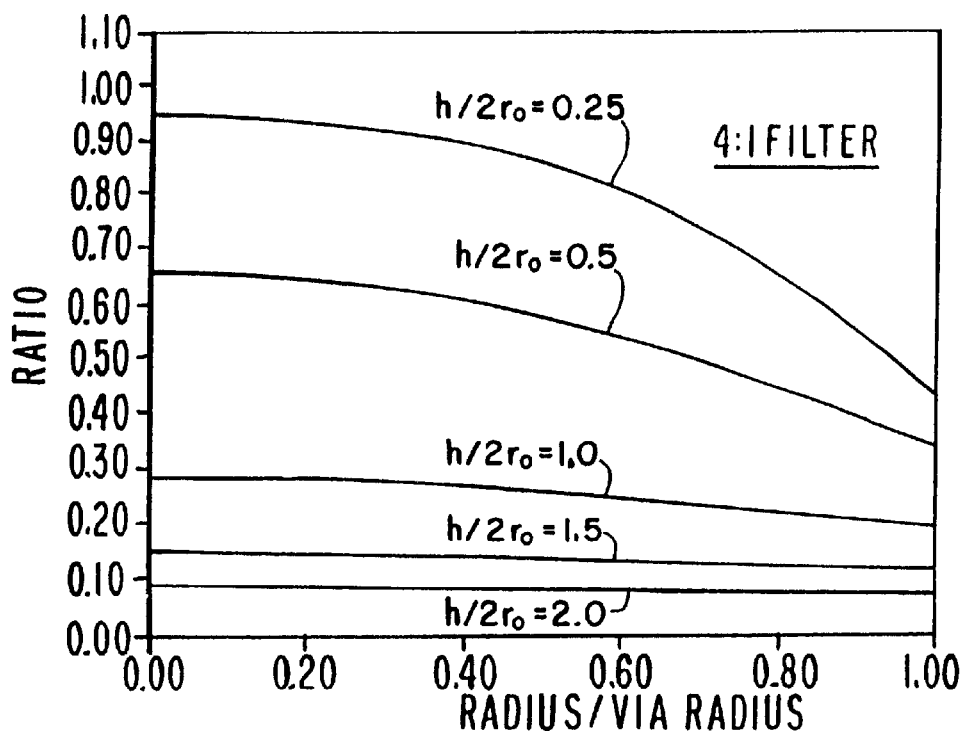

FIGS. 6a–6d illustrate the relationship between the initial deposition rate on the bottom wall and the aspect ratios of holes or vias and collimating filters. In these figures, distance from the center of the hole or via expressed as a fraction of the radius of the hole or via is plotted along the x-axis, and the rate of deposition on the bottom wall normalized to the rate of deposition on the surface of the wafer is plotted along the y-axis. The target is assumed to be sufficiently large that the location of the opening on the wafer is unimportant. Curves are included for holes having aspect ratios ranging from 0.25:1 to 2:1. FIG. 6a shows the relationship without a collimating filter, and FIGS. 6b–6d show the relationship for filters having aspect ratios of 1:1, 2:1 and 4:1, respectively.

With no filter and a hole having an aspect ratio of 1:1, the coating is full thickness toward the center of the opening but only about half thickness near the wall. With a filter having an aspect ratio of 1:1, the coating on the bottom wall is substantially more uniform, ranging from a normalized value of about 0.70 toward the center to about 0.40 near the wall. The bottom coating is even flatter with filters having aspect ratios of 2:1 and 4:1, but it is also substantially thinner.

With no filter and a hole having an aspect ratio of 2:1, the bottom coating varies in thickness from a normalized value of about 0.60 toward the center to about 0.30 near the wall. With a filter having an aspect ratio of 1:1, the coating is more uniform, ranging from a normalized thickness of about 0.26 near the center to about 0.20 toward the wall. With a 2:1 filter, the coating is even more uniform, with a normalized thickness of about 0.13 from the center to the wall.

It can be seen that there is a trade-off between uniformity across the bottom of a via and deposition rate at the bottom. Increasing the aspect ratio of the filter tends to improve uniformity at the expense of deposition rate.

Figure 7A:
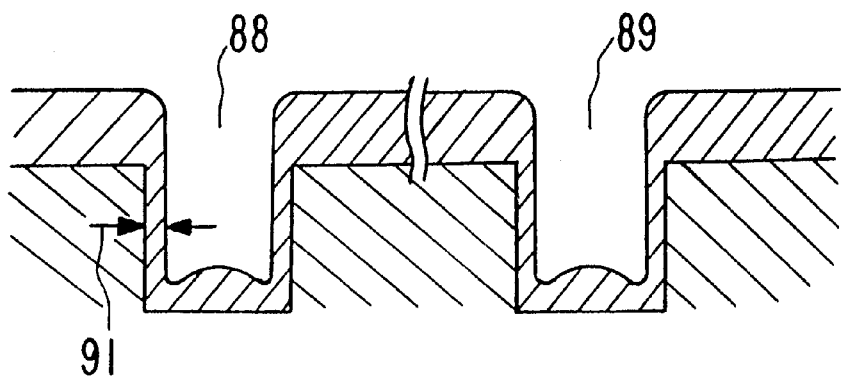
FIGS. 7a–7b are fragmentary cross-sectional views of a workpiece, illustrating the formation of a step coating with the apparatus and method of the invention.
Figure 7B:
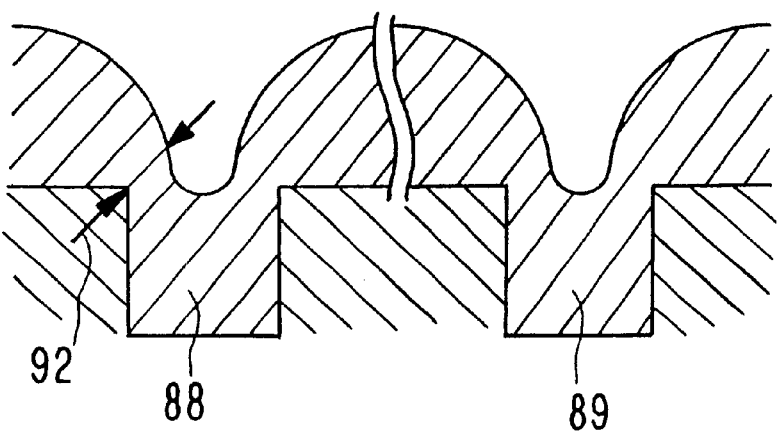

FIGS. 7a–7b illustrate the formation of a step coating when the apparatus and method of the invention are employed. Each of these figures shows a pair of holes 88, 89 having aspect ratios of 1:1, with hole 88 being located near the center of a wafer and hole 89 being toward the edge. Sputtering is performed at a pressure of 0.5 milliTorr and a wafer table temperature of 250° C., with an 11.25 inch planar source, a 7 cm target to wafer spacing, a collimation filter having an aspect ratio of 1:1, and a surface deposition rate of 1 micron per minute.

FIG. 7a shows a half thickness coating of 0.5 micron on the wafer surface, and FIG. 7b shows a full thickness coating of 1 micron on the surface. The figures illustrate how the coating builds up evenly on the side walls of the openings without the overcoating and asymmetry of the prior art techniques illustrated in FIGS. 3a–3b. Another advantage of the invention which is apparent from these figures is that the thinnest part of the step coating is no longer at the lower corner of the hole as it is in the coatings of FIGS. 3a–3b. Film integrity at the corner of a via is especially important in obtaining a coating within the via having good, reliable electrical properties. With the half thickness coating, the thinnest point occurs along the side wall, as indicated by the arrows 91, and with the full thickness coating, it occurs at the upper corner of the hole, as indicated by the arrows 92. From these figures, it can also be noted that the aspect ratio of the unfilled volume increases as the coating builds up in the holes.

As described above, in one embodiment of the present invention, a titanium collimation filter is used in connection with sputtering from targets comprising titanium. The number of extraneous particles created when using a titanium collimation filter are greatly reduced from those of the prior art. Indeed, particle counts are such that sputtering of titanium compounds using a titanium collimation filter can be as clean or cleaner than the deposition of comparable materials by chemical vapor deposition (CVD).

Heretofore, attempts at collimated sputtering of titanium, titanium nitride, and titanium/tungsten alloy have not been practical due to creation of an unacceptable number of extraneous particles as the deposited film grew in thickness on the collimator cells. The present invention solves that problem. In one experiment, for example, particles of titanium nitride began flaking off of a stainless steel collimation filter after only running 400 wafers. Under the same conditions, but substituting a titanium collimation filter, no significant flaking of titanium nitride occurred until after approximately 3500 wafers had been processed, and it is believed that flaking only began at this point due to the presence of other stainless steel components in the sputter chamber, i.e., there was no apparent flaking from the collimator itself. This experiment represents more than sevenfold improvement and makes the collimated sputtering of titanium nitride practical. In another experiment 5500 wafers were processed before flaking occurred. In this experiment, a mounting ring on the collimator, that previously had been constructed of stainless steel, was also made of titanium, confirming the fact that other components in the processing chamber can contribute to extraneous particle creation.

It is noted that the useful life of a collimator used in connection with a sputtering source is limited. As sputtering is performed, film is deposited on and builds up on the surfaces of the collimator, including the collimator cells. As the thickness of the coating on the cells increases, the deposition rate and properties of the sputtered film changes. Eventually, the collimator must be replaced. It has been found a collimator of the present invention, which is matched in materials properties with the film being deposited, is usable over a normal life without any flaking.

In accordance with the present invention, it may be desirable to fabricate other components within sputtering chamber from a material that is similarly compatible with the film to be deposited. The extent of the benefit of using a compatible material to fabricate another component will depend on the amount of film which is deposited on the component as the sputtering system is used, since flaking occurs as film thickness increases. A collimation filter, or other component, which is placed directly between the sputter source and the workpiece, will experience rapid film build up and, therefore, will begin flaking relatively quickly if there is a materials incompatibility problem. On the other hand, a cathode shield will experience little or no film deposition and, therefore, need not be made of a compatible material if doing so has any other disadvantages, such as higher manufacturing costs.

It is believed that the major factor accounting for the very high quality of sputtering attainable when using a titanium collimator for aforementioned films is the fact that there is no mismatch between the thermal coefficient of expansion of the sputtered material and the material from which the collimation filter is made. This matching of the thermal expansion characteristics obviates one of the primary causes of extraneous particle formation, i.e., flaking or spalling of the film deposited on the collimation filter as the filter and film undergo thermal cycling.

The thermal coefficient of expansion (TCE) of both titanium and titanium nitride is 6.0. (This is expressed in English units of $10^{-6}$ inches per inch degree Fahrenheit.) With titanium nitride a very low mismatch is essential due to the brittleness and low ductility of the film. Other films that are more ductile, or which have better adhesion characteristics, can tolerate a greater mismatch. For example, titanium tungsten alloy has a TCE of 3.0, yet adheres well to a titanium collimator. Likewise, aluminum, with a TCE of 13 adheres well to a stainless steel collimator (TCE of 9.9).

Titanium has one additional property which makes it highly suitable for the present application: it tends to be an adsorber of gas. Many materials, including many metals, will "outgas" in a vacuum environment thereby introducing potentially contaminating substances into the process chamber. While such outgassing can be controlled by first "baking-out" the part to accelerate the outgassing, frequently it is not possible to fully bake out a part in a reasonable time-period, so that it remains a potential source of contamination. Moreover, even if baked out, the part may be recontaminated if it is subsequently exposed to the ambient atmosphere. Although load-locks are commonly used in sputtering equipment, the process chambers may be, nonetheless, frequently exposed to the atmosphere. This is not a problem with titanium, insofar as it tends not to outgas.

While the present invention has been described in connection with a titanium collimation filter, it will be apparent to those skilled in the art that the principle of materials compatibility may have equal application to the sputtering of other types of films. As noted above, extraneous particle creation has not been a problem with the sputtering of aluminum using a stainless steel collimation filter. However, when sputtering other less commonly used materials, and particularly non-metallic materials or other materials which are brittle or not ductile, it can be anticipated that similar problems will arise. Accordingly, the present invention is intended to encompass these other materials whereby a collimation filter having a high degree of compatibility with the sputtered film is used. In particular, according to the present invention it is desirable to use a collimation filter having a thermal coefficient of expansion which closely matches that of the deposited film. In addition, the collimation filter should be made of a material which has excellent adherence qualities relative to the sputtered film; i.e., the bonding forces between film and collimation filter are strong over the range of operating temperatures of the system.

It is apparent from the foregoing that a new and improved sputtering apparatus and method have been provided. While only certain presently preferred embodiments have been described in detail, as will be apparent to those familiar with the art, certain changes and modifications can be made without departing from the scope of the invention as defined by the following claims.

What is claimed is:

1. A magnetron sputtering apparatus for depositing a brittle film on a workpiece, comprising:
   a vacuum chamber,
   workpiece holding means situated within said vacuum chamber for holding a workpiece to be sputter coated,
   a sputtering source for emitting particles used to deposit a film of brittle material on said workpiece in said vacuum chamber, said sputtering source generally opposing said workpiece to be coated, and
   a collimator interposed between said workpiece and said sputtering source for limiting angles of the particles emitted from said sputtering source which pass through said collimator,
   said collimator comprising a plurality of individual collimator cells, said collimator cells being made of a material which has substantially the same thermal coefficient of expansion as said brittle material to be deposited on said workpiece.

2. The sputtering apparatus of claim 1, wherein the material to be deposited is non-metallic.

3. The sputtering apparatus of claim 1, wherein other components having exposed surfaces situated within said vacuum chamber are made of substantially the same material as the collimator cells.

4. The sputtering apparatus of claim 1, wherein said thermal coefficient of expansion of said collimator means is substantially equal to $6.0 \times 10^{-6}$ inches per inch per degree Fahrenheit.

5. The sputtering apparatus of claim 1 wherein said film to be formed on said workpiece is titanium nitride.

6. A magnetron sputtering apparatus for depositing a film on a workpiece, comprising:
   a vacuum chamber,
   stationary workpiece holding means situated within said vacuum chamber for holding a workpiece to be sputter coated in a stationary position,
   stationary sputtering means for emitting particles used to form a film on said workpiece into said vacuum chamber, said sputtering means generally opposing said workpiece to be coated, said sputtering means comprising a stationary sputter target from which said sputtered particles are uniformly emitted and having an area larger than the workpiece to be coated, said area including the central portion of the sputter target, said sputter target having a first surface which faces said workpiece and a second surface, said sputtering means further comprising a rotating closed loop magnet positioned adjacent to the second surface of said sputter target,
   stationary collimator means interposed between said workpiece and said sputtering means for limiting the angles of the particles which pass through said collimator means,
   said collimator means comprising a plurality of substantially identical individual collimator cell, said collimator cells having an aspect ratio in the range of 0.5:1 to 4:1, said collimator means being spaced apart from said workpiece by a distance of at least one inch,
   pressure reducing means for maintaining a reduced pressure within said vacuum chamber such that there is no substantial scattering of said particles between said collimator means and said workpiece.

7. The sputtering apparatus of claim 6, wherein said collimator cells are constructed from stamped pieces of titanium ribbon.

8. The sputtering apparatus of claim 6, wherein said collimator means is made of a material which has substantially the same thermal coefficient of expansion as the film which is to be formed on the workpiece.

9. The sputtering apparatus of claim 8, wherein said film to be formed on the workpiece is titanium nitride.

10. A magnetron sputtering apparatus for depositing a non-metallic film on a workpiece, comprising:
    a vacuum chamber,
    workpiece holding means situated within said vacuum chamber for holding said workpiece to be sputter coated with a non-metallic film;
    sputtering means for emitting particles used to form said non-metallic film on said workpiece in said vacuum chamber, said sputtering means generally opposing said workpiece to be coated, and
    collimator means interposed between said workpiece and said sputtering means for limiting angles of the particles which pass through said collimator means, wherein said collimator means is made of a metallic material which has a thermal coefficient of expansion which is sufficiently similar to said non-metallic film, such that there is no substantial flaking of said non-metallic film within said vacuum chamber during the useful life of said collimator means.

11. The sputtering apparatus of claim 10, wherein said non-metallic film is titanium nitride.

12. The sputtering apparatus of claim 10, wherein said thermal coefficient of expansion of said collimator means is substantially equal to $6.0 \times 10^{-6}$ inches per inch per degree Fahrenheit.

13. The sputtering apparatus of claim 10, said non-metallic film comprising a nonductile material.

14. A method of sputter coating a film of brittle material onto a workpiece, comprising the steps of:
    positioning the workpiece in a vacuum chamber in an opposing relationship to a sputtering source which emits particles on said workpiece and which is larger than said workpiece, passing the particles emitted from said sputtering source through a collimation filter interposed between said workpiece and said sputtering source, said collimation filter being made of a material selected in order to have substantially the same thermal coefficient of expansion as the brittle material of the film deposited on said workpiece such that there is substantially no flaking of film to build up on said collimation filter as sputtering is conducted over the life of said collimation filter.

15. A method of sputter coating a non-metallic film onto a workpiece, comprising the steps of:

selecting a collimation filter constructed of a metallic material which has substantially the same thermal coefficient of expansion as the non-metallic film being coated onto the workpiece;

positioning the workpiece in a vacuum chamber in an opposing relationship to a sputtering source which emits particles toward said workpiece and which is larger than said workpiece;

positioning the collimation filter between the workpiece and the sputtering source; and passing the particles emitted from said sputtering source through the collimation filter interposed between said workpiece and said sputtering source.

* * * * *